(12) United States Patent
Qiu

(10) Patent No.: US 12,087,240 B2
(45) Date of Patent: Sep. 10, 2024

(54) DISPLAY PANEL DRIVING METHOD OF OUTPUTTING DIFFERENT CONTROL SIGNALS DEPENDING ON WHETHER INITIALIZATION OF A TIMING CONTROL CHIP IS COMPLETED FOR ENABLING OR DISENABLING DATA OUTPUT OF A DATA DRIVER CHIP, AND DISPLAY PANEL IMPLEMENTING THE DISPLAY PANEL DRIVING METHOD

(71) Applicant: HKC Corporation Limited, Shenzhen (CN)

(72) Inventor: Bin Qiu, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 354 days.

(21) Appl. No.: 16/349,608

(22) PCT Filed: Nov. 13, 2018

(86) PCT No.: PCT/CN2018/115209
§ 371 (c)(1),
(2) Date: May 13, 2019

(87) PCT Pub. No.: WO2020/087568
PCT Pub. Date: May 7, 2020

(65) Prior Publication Data
US 2021/0327369 A1 Oct. 21, 2021

(30) Foreign Application Priority Data
Oct. 31, 2018 (CN) .......................... 201811282986.0

(51) Int. Cl.
G09G 3/34 (2006.01)
G09G 3/36 (2006.01)
H03M 1/66 (2006.01)

(52) U.S. Cl.
CPC ......... *G09G 3/3406* (2013.01); *G09G 3/3685* (2013.01); *H03M 1/66* (2013.01);
(Continued)

(58) Field of Classification Search
CPC .... G09G 3/006; G09G 3/2092; G09G 3/2096; G09G 3/34; G09G 3/3406; G09G 3/342;
(Continued)

(56) References Cited

U.S. PATENT DOCUMENTS 9,269,305 B2 2/2016 Hussain
2006/0158441 A1 7/2006 Lee
(Continued)

FOREIGN PATENT DOCUMENTS

CN 101866637 A 10/2010
CN 102044223 5/2011
(Continued)

OTHER PUBLICATIONS

International Search Report issued in corresponding international application No. PCT/CN2018/115209, mailed Jul. 30, 2019(7 pages).
(Continued)

*Primary Examiner* — Keith L Crawley

(57) ABSTRACT

The present application discloses a display panel driving method and a display panel thereof. The display panel driving method includes: a timing control chip performs initial configurations; the timing control chip generates a control signal; and an output enable circuit receives the control signal to control picture display of a display panel.

14 Claims, 4 Drawing Sheets

(52) U.S. Cl.
CPC ............. *G09G 2310/027* (2013.01); *G09G 2320/0252* (2013.01); *G09G 2320/0653* (2013.01); *G09G 2330/021* (2013.01)

(58) Field of Classification Search
CPC ...... G09G 3/36; G09G 3/3611; G09G 3/3685; G09G 3/3688; G09G 3/3692; G09G 5/001; G09G 5/003; G09G 5/005; G09G 5/006; G09G 2310/0264; G09G 2310/027; G09G 2310/0291; G09G 2310/0297; G09G 2310/08; G09G 2320/0252; G09G 2320/0653; G09G 2320/0693; G09G 2330/02; G09G 2330/021; G09G 2330/022; G09G 2330/026; G09G 2370/022; H03M 1/66
See application file for complete search history.

(56) References Cited

U.S. PATENT DOCUMENTS

| | | | | |
|---|---|---|---|---|
| 2007/0109450 | A1* | 5/2007 | Lee | H04L 12/12 348/730 |
| 2008/0186290 | A1* | 8/2008 | Tsai | G09G 3/3696 345/204 |
| 2009/0058194 | A1* | 3/2009 | Lee | G09G 3/3685 307/130 |
| 2009/0153220 | A1* | 6/2009 | Lee | H03K 17/22 327/333 |
| 2009/0177930 | A1* | 7/2009 | Park | G09G 3/2003 714/49 |
| 2011/0199397 | A1* | 8/2011 | Ko | G09G 3/3688 345/690 |
| 2014/0049572 | A1* | 2/2014 | Sacchetto | G09G 3/3406 345/691 |
| 2016/0372072 | A1* | 12/2016 | Wu | G09G 3/3688 |
| 2017/0206851 | A1* | 7/2017 | Sun | G09G 3/3696 |
| 2019/0197945 | A1* | 6/2019 | Kim | G09G 3/20 |

FOREIGN PATENT DOCUMENTS

| | | |
|---|---|---|
| CN | 103366702 | 10/2013 |
| CN | 103474015 A | 12/2013 |
| CN | 105791999 | 7/2016 |
| CN | 106293750 A | 1/2017 |
| CN | 106297655 | 1/2017 |
| CN | 107391180 | 11/2017 |

OTHER PUBLICATIONS

First Office Action from China patent office in a counterpart Chinese patent Application 201811282986.0, mailed Dec. 3, 2019 (9 pages).
Second Office Action from China patent office in a counterpart Chinese patent Application 201811282986.0, mailed Jun. 10, 2020 (6 pages).
Written Opinion of the International Searching Authority for No. PCT/CN2018/115209.

* cited by examiner

DISPLAY PANEL DRIVING METHOD OF OUTPUTTING DIFFERENT CONTROL SIGNALS DEPENDING ON WHETHER INITIALIZATION OF A TIMING CONTROL CHIP IS COMPLETED FOR ENABLING OR DISENABLING DATA OUTPUT OF A DATA DRIVER CHIP, AND DISPLAY PANEL IMPLEMENTING THE DISPLAY PANEL DRIVING METHOD

The present application claims priority to the Chinese Patent Application No. CN201811282986.0, filed to the Chinese Patent Office on Oct. 31, 2018, and entitled "DISPLAY PANEL DRIVING METHOD AND DISPLAY PANEL THEREOF", which is incorporated herein by reference in its entirety.

TECHNICAL FIELD

The present application relates to the technical field of display, and in particular to a display panel driving method and a display panel thereof.

BACKGROUND

The statements in this section merely provide background information related to the present application and may not constitute prior art.

Along with the development and progress of science and technology, a Liquid Crystal Display (LCD) has become a mainstream display product and is widely applied because of hot points such as a thin body, power saving and low radiation. It is known by an inventor that most LCDs are backlight type LCDs and each LCD includes a liquid crystal panel and a backlight module. A working principle of the liquid crystal panel is to place liquid crystal molecules into two parallel glass substrates and apply a drive voltage onto the two glass substrates to control rotation directions of the liquid crystal molecules, thereby refracting light rays of the backlight module to generate a picture.

When the liquid crystal panel is just started, a Timing Controller Integrated Circuit (TCON IC) takes a certain time to read an external code and complete initial configuration settings of a register inside the IC, and as a matter of fact, an output of the TCON IC is in an unstable state during this period of time, so a condition of an abnormal startup screen is occurred easily. At present, this is mainly solved by pushing a turn-on time of a backlight module back to some extent during just starting. i.e., when the TCON IC is unstable, the backlight module is not turned on first and then after the output of the TCON IC is stable, the backlight module is turned on. However, such a manner prolongs the starting time, resulting in a complaint of a user.

SUMMARY

An object of the present application is to provide a display panel driving method and a display panel thereof to solve a condition of an abnormal startup screen.

To this end, the present application provides a display panel driving method, which includes:
  reading, by a timing control chip, an initial code, and performing initial configurations;
  detecting, by the timing control chip, whether configuration work of the initial code is completely finished or not, and correspondingly generating different control signals; and
  receiving, by an output enable circuit, a control signal, and controlling data output of a data drive chip according to the control signal, so as to control picture display of a display panel.

Optionally, the step of detecting, by the timing control chip, whether configuration work of the initial code is completely finished or not, and correspondingly generating different control signals includes:
  when it is detected that the timing control chip is in a code reading and configuration process, controlling to output, by the timing control chip, a low-level enable signal to take as the control signal; and
  when it is detected that the timing control chip finishes all code configurations, outputting, by the timing control chip, a high-level enable signal to take as the control signal.

Optionally, the step of receiving, by an output enable circuit, an enable signal, and controlling data output of a data drive chip according to the enable signal, so as to control picture display of a display panel includes:
  controlling to disconnect an output port of the data drive chip when the enable signal received by the output enable circuit is at a low level; and
  controlling to restore the output port of the data drive chip when the enable signal received by the output enable circuit is at a high level.

Optionally, the timing control chip includes a control circuit; the control circuit detects whether the configuration work of the initial code of the timing control chip is completely finished or not, and outputs the enable signal to the data drive chip;
  the data drive chip includes the output enable circuit; the output enable circuit receives the enable signal, and controls the data output of the data drive chip according to the enable signal to control voltages at two ends of a liquid crystal panel, thereby controlling the display of the display panel.

The present invention further discloses a display panel driving method, which includes:
  reading, by a timing control chip, an initial code, and performing initial configurations;
  when it is detected that the timing control chip is in a code reading and configuration process, controlling to output, by the timing control chip, a low-level enable signal; and when it is detected that the timing control chip finishes all code configurations, outputting, by the timing control chip, a high-level enable signal;
  receiving drive data of the timing control chip;
  storing the drive data to a row data memory;
  converting the drive data into an analog voltage via a Digital-to-Analog Converter (DAC), and then performing power amplification via a power amplification circuit;
  when an output enable circuit receives the low-level enable signal, disconnecting, by the output enable circuit, data output of the power amplification circuit so as to control a display panel to display a black screen; and
  when the output enable circuit receives the high-level enable signal, restoring, by the output enable circuit, the data output of the power amplification circuit so as to control the display panel to perform picture display according to the drive data of the data drive chip.

The present invention further discloses a display panel, which includes:
  a backlight module, disposed in the display panel, and turned on while the display panel is started;

a timing control chip, configured to read an initial code and perform initial configurations after the display panel is started, and simultaneously, detect whether configuration work of the initial code is completely finished or not, and correspondingly generate different control signals;

an output enable circuit, where the output enable circuit receives a control signal, and controls data output of a data drive chip according to the control signal to control voltages at two ends of a liquid crystal panel; and the data drive chip, configured to control the voltages at the two ends of the liquid crystal panel according to control of the output enable circuit, thereby controlling picture display of the display panel.

Optionally, the timing control chip includes:

a control circuit, located in the timing control chip, and configured to detect whether the configuration work of the initial code of the timing control chip is finished or not, and corresponding generate a high-level or low-level enable signal to take as the control signal;

the data drive chip includes:

a row data memory, configured to store drive data;

a DAC, configured to convert the drive data into an analog voltage; and a power amplification circuit, configured to amplify a power of the analog voltage to output to a data line.

Optionally, the output enable circuit is coupled to the power amplification circuit; and the output enable circuit receives the enable signal, and disconnects or restores data output of the power amplification circuit according to the enable signal.

Optionally, the output enable circuit is coupled between the DAC and the power amplification circuit; and the output enable circuit receives the enable signal, and disconnects or restores data transmission between the DAC and the power amplification circuit according to the enable signal.

Optionally, the output enable circuit is coupled between the row data memory and the DAC; and the output enable circuit receives the enable signal, and disconnects or restores data transmission between the row data memory and the DAC according to the enable signal.

Compared with a solution in which a turn-on time of a backlight module is pushed back to some extent, i.e., when a TCON IC is unstable, the backlight module is not turned on first, and then after an output of the TCON IC is stable, the backlight module is turned on, in the present application, while the display panel is started, the backlight module is turned on so that a condition in which the starting time is too long may be reduced. However, since the timing control chip is unstable, a condition of the abnormal startup screen is easily occurred. The timing control chip reads the initial code and performs the initial configurations, and the timing control chip generates the different control signals according to whether the configurations are completely finished or not to send to the output enable circuit. In this sense, the output enable circuit can control the data output of the data drive chip according to the different control signals, e.g., before the configurations are finished, the output enable circuit may disconnect the work of the data drive chip by sending a corresponding control signal. Since a voltage difference between the two ends of the liquid crystal panel is zero, the penetration of light cannot be controlled and the black screen appears. As a result, even though the backlight module is turned on in advance, there is no phenomenon that the user sees the abnormal startup screen.

BRIEF DESCRIPTION OF THE DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts.

In the accompanying drawings.

DETAILED DESCRIPTION

Figure 1:
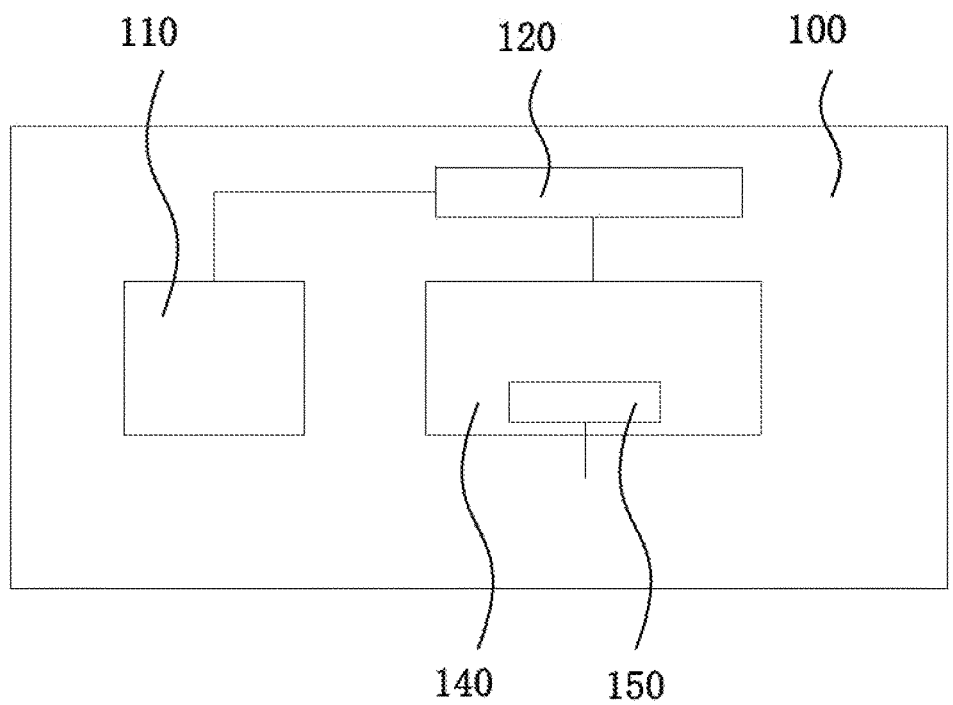
FIG. 1 is a schematic diagram of a display module in an embodiment of the present application.

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal". "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying a relative importance, or implicitly indicating the number of the indicated technical features. Hence, the features defined by "first" and "second" can explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or coupled; or directly connected or indirectly connected through an intermediate medium, or in an internal communication between two elements. The specific meanings about the foregoing terms in the present application may be understood by those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

The present application will be further described below in combination with the accompanying drawings and optional embodiments.

As shown in FIG. 1 to FIG. 5, an embodiment of the present application discloses a display panel 100 driving method, which includes:

S31: While a display panel 140 is started, a backlight module 150 of the display panel 140 is turned on.

S32: A timing control chip 110 reads an initial code, and performs initial configurations.

S33: The timing control chip 110 detects whether configuration work of the initial code is completely finished or not, and correspondingly generates different control signals 112.

S34: An output enable circuit 124 receives a control signal 112, and controls data output of a data drive chip 120 according to the control signal 112, so as to control picture display of the display panel 140.

In this solution, while the display panel 140 is started, the backlight module 150 is turned on so that a condition in which the starting time is too long may be reduced. However, since the timing control chip 110 is unstable, a condition of the abnormal startup screen is easily occurred. The timing control chip 110 reads the initial code and performs the initial configurations, and the timing control chip 110 generates the different control signals 112 according to whether the configurations are completely finished or not to send to the output enable circuit 124. In this sense, the output enable circuit 124 can control the data output of the data drive chip 120 according to the different control signals 112, e.g., before the configurations are finished, the output enable circuit 124 may disconnect the work of the data drive chip 120 by sending a corresponding control signal 112. Since a voltage difference between the two ends of the liquid crystal panel is zero, the penetration of light cannot be controlled and the black screen appears. As a result, even though the backlight module is turned on in advance, there is no phenomenon that the user sees the abnormal startup screen.

In this embodiment, optionally, the step that the timing control chip 110 detects whether configuration work of the initial code is completely finished or not, and correspondingly generates different control signals 112 includes:

S41: The timing control chip 110 performs initial configurations.

S42-1: When it is detected that the timing control chip 110 is in a code reading and configuration process, the timing control chip 110 controls to output a low-level enable signal 113 to take as the control signal 112.

S42-2: When it is detected that the timing control chip 110 finishes all code configurations, the timing control chip 110 outputs a high-level enable signal 113 to take as the control signal 112.

In this solution, the timing control chip 110 may detect an own configuration condition, may output the low-level enable signal 113 after the display panel is started and before the configurations are finished, and may also output the high-level enable signal 113 after all configurations are finished. Through a state of the enable signal 113, the output enable circuit 124 is notified of the configuration condition of the timing control chip 110. In this way, the display panel 140 may be controlled according to different states to perform different displays, and thus conditions of the abnormal startup screen and the like due to the fact that the backlight module is turned on in advance are prevented.

In this embodiment, optionally, the step that an output enable circuit 124 receives an enable signal 113, and controls data output of a data drive chip 120 according to the enable signal 113, so as to control display of the display panel 140 includes: the data drive chip 120 receives the enable signal; an output port of the data drive chip 120 is controlled to be disconnected when the enable signal 113 received by the output enable circuit 124 is at a low level; and the output port of the data drive chip 120 is controlled to be restored when the enable signal 113 received by the output enable circuit 124 is at a high level.

In this solution, the output port of the data drive chip 120 is controlled to be disconnected when the enable signal 113 received by the output enable circuit 124 is at the low level, and the output port of the data drive chip 120 is controlled to be restored when the enable signal 113 received by the output enable circuit 124 is at the high level. In this way, the output enable circuit 124 may know the configuration state of the timing control chip 110 according to the state of the enable signal 113. If the timing control chip 110 is in the configuration state and before all configurations are finished, the work of the data drive chip 120 is disconnected. Since the voltage difference between the two ends of the liquid crystal panel is zero, the penetration of light cannot be controlled and the black screen appears. As a result, even though the backlight module is turned on in advance, there is no phenomenon that the user sees the abnormal startup screen. However, when the timing control chip 110 finishes the configurations, since the backlight module 150 is turned on early and completes the preparation, the picture display can be performed immediately as long as the output port of the data drive chip 120 is restored by the output enable circuit 124, and thus the starting time is saved.

In this embodiment, optionally, the timing control chip 110 includes a control circuit 111; the control circuit 111 detects whether the configuration work of the initial code of the timing control chip 110 is completely finished or not, and controls to output the enable signal 113 to the data drive chip 120; the data drive chip 120 includes the output enable circuit 124; the output enable circuit 124 receives the enable signal 113, and controls the data output of the data drive chip 120 according to the enable signal 113 to control voltages at two ends of a liquid crystal panel, thereby controlling the display of the display panel 140.

In this solution, the data drive chip 120 includes the output enable circuit 124; the output enable circuit 124 receives the enable signal 113, and controls the data output of the data drive chip 120 according to the state of the enable signal 113 to control the voltages at the two ends of the liquid crystal panel, thereby controlling the display of the display panel 140; and thus, the condition of the abnormal startup screen due to the fact that the display panel 140 starts to display when the display panel 140 is started and the timing control chip 110 reads the initial code and performs the initial configurations is prevented.

In this embodiment, optionally, the step that the data drive chip 120 controls the picture display includes:

S51: Receive drive data of the timing control chip 110.

S52: Store the drive data to a row data memory.

S53: Convert the drive data into an analog voltage via a DAC, and then perform power amplification via a power amplification circuit 123 to output to a data line, thereby controlling the picture display of the display panel 140.

The step that an output enable circuit 124 receives a control signal 112, and controls data output of a data drive chip 120 according to the control signal 112, so as to control display of the display panel 140 includes:

S54: The output enable circuit receives the enable signal 113, and disconnects or restores data output of the power amplification circuit 123 according to the enable signal 113.

In this solution, the data drive chip 120 receives the drive data, the drive data are stored in the row data memory, the data are converted into the analog voltage via the DAC 122, and then the analog voltage is subject to the power amplification via the power amplification circuit 123 to output to the data line; the output enable circuit 124 is increased in the data drive module to receive the enable signal 113 sent out by the timing control chip 110; and the output enable circuit 124 disconnects or restores the data output of the power amplification circuit 123 according to the enable signal 113 to control the voltages at the two ends of the liquid crystal panel, thereby controlling the picture display of the display panel 140.

In this embodiment, optionally, the step that the data drive chip 120 controls the picture display includes: receive drive data of the timing control chip 110; store the drive data to a row data memory 130; and convert the drive data into an analog voltage via a DAC 122, and then perform power amplification via a power amplification circuit 123 to output to a data line, thereby controlling the picture display of the display panel 140; the step that an output enable circuit 124 receives an enable signal 113, and controls data output of a data drive chip 120 according to the enable signal 113 to control voltages at two ends of the liquid crystal panel, thereby controlling display of the display panel 140 includes: the output enable circuit receives the enable signal 113, and disconnects or restores data transmission between the DAC 122 and the power amplification circuit 123 according to the enable signal 113.

In this solution, the data drive chip 120 receives the drive data, the drive data are stored in the row data memory, the data are converted into the analog voltage via the DAC 122, and then the analog voltage is subject to the power amplification via the power amplification circuit 123 to output to the data line; the output enable circuit 124 is increased in the data drive module to receive the enable signal 113 sent out by the timing control chip 110; and the output enable circuit 124 disconnects or restores data transmission between the DAC 122 and the power amplification circuit 123 according to the enable signal 113 to control the voltages at the two ends of the liquid crystal panel, thereby controlling the picture display of the display panel 140.

In this embodiment, optionally, the step that the data drive chip 120 controls the picture display includes: receive drive data of the timing control chip 110; store the drive data to a row data memory 130; and convert the drive data into an analog voltage via a DAC 122, and then perform power amplification via a power amplification circuit 123 to output to a data line, thereby controlling the picture display of the display panel 140; the step that an output enable circuit 124 receives an enable signal 113, and controls data output of a data drive chip 120 according to the enable signal 113 to control voltages at two ends of the liquid crystal panel, thereby controlling display of the display panel 140 includes: the output enable circuit receives the enable signal 113; and the output enable circuit 124 disconnects or restores data transmission between the row data memory 130 and the DAC 122 according to the enable signal 113.

In this solution, the data drive chip 120 receives the drive data, the drive data are stored in the row data memory, the data are converted into the analog voltage via the DAC 122, and then the analog voltage is subject to the power amplification via the power amplification circuit 123 to output to the data line; the output enable circuit 124 is increased in the data drive module to receive the enable signal 113 sent out by the timing control chip 110; and the output enable circuit 124 disconnects or restores data transmission between the row data memory 130 and the DAC 122 according to the enable signal 113 to control the voltages at the two ends of the liquid crystal panel, thereby controlling the picture display of the display panel 140.

The above three disconnection methods are methods claimed in the present application, and it may further be appropriate to combine any two together to block the data output of the data drive chip 120.

Figure 2:
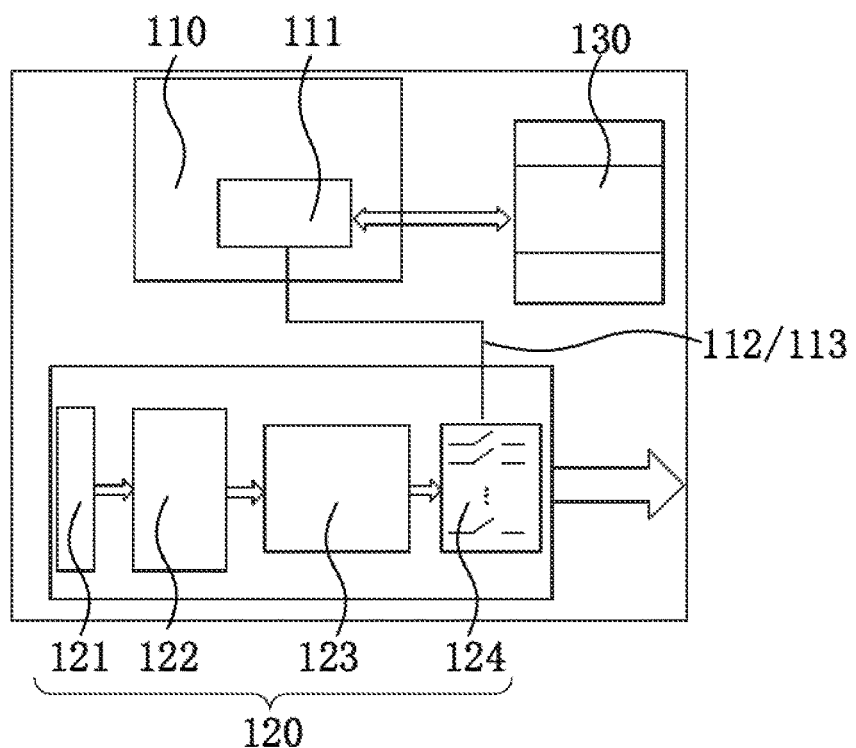
FIG. 2 is a schematic diagram of a display module driving method in an embodiment of the present application.
Figure 3:
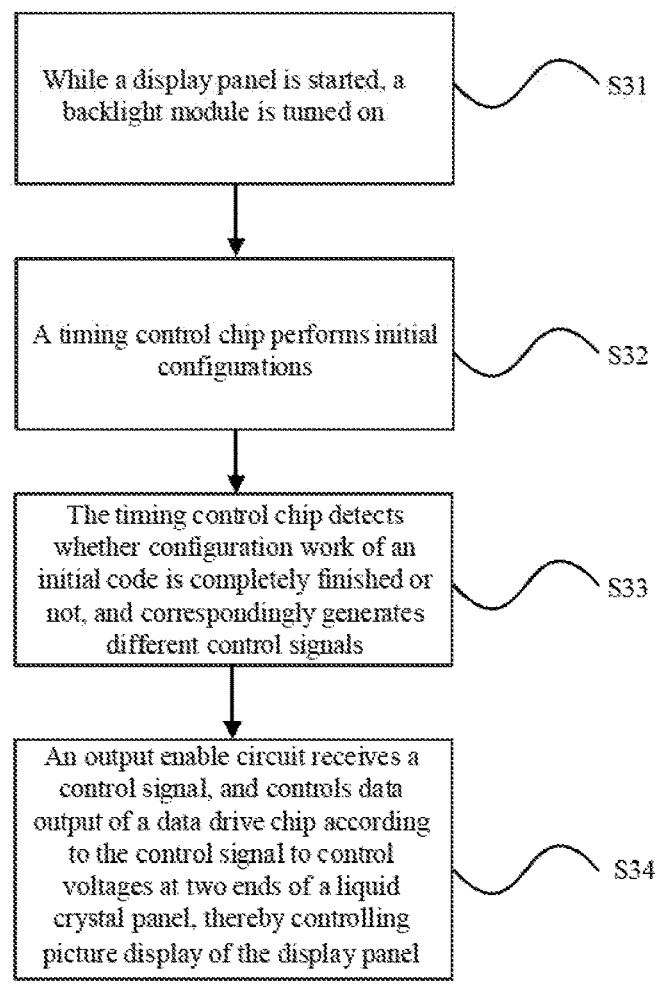
FIG. 3 is a flowchart diagram of a display panel driving method in an embodiment of the present application.
Figure 4:
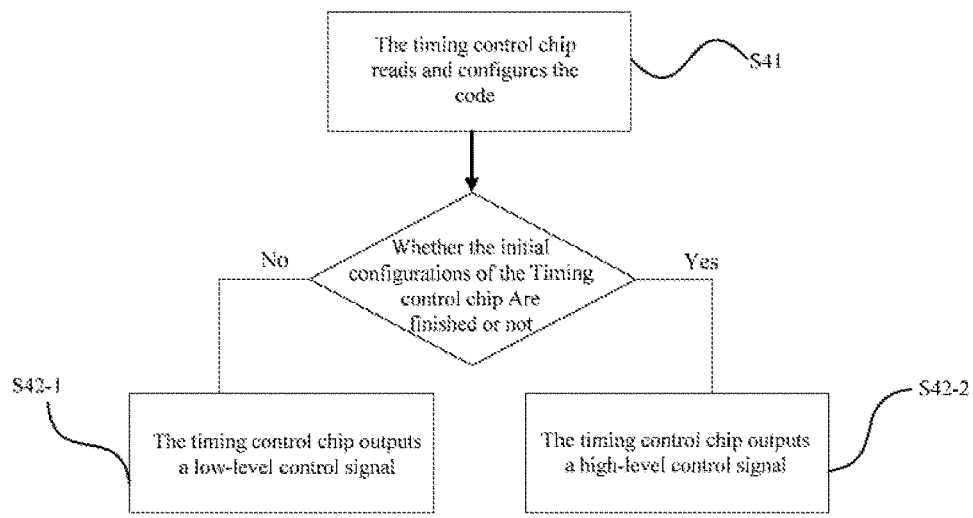
FIG. 4 is a flowchart diagram of a timing control chip driving method in an embodiment of the present application.
Figure 5:
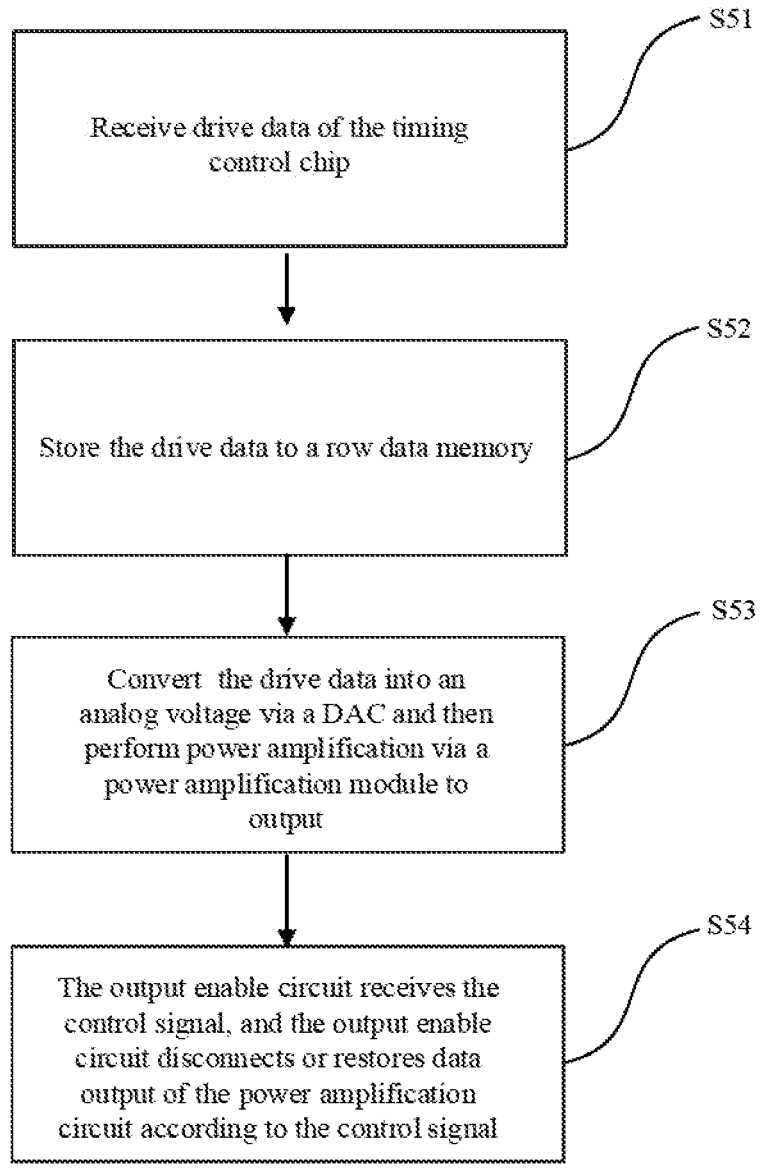
FIG. 5 is a flowchart diagram of a data drive chip driving method in an embodiment of the present application.
Figure 6:
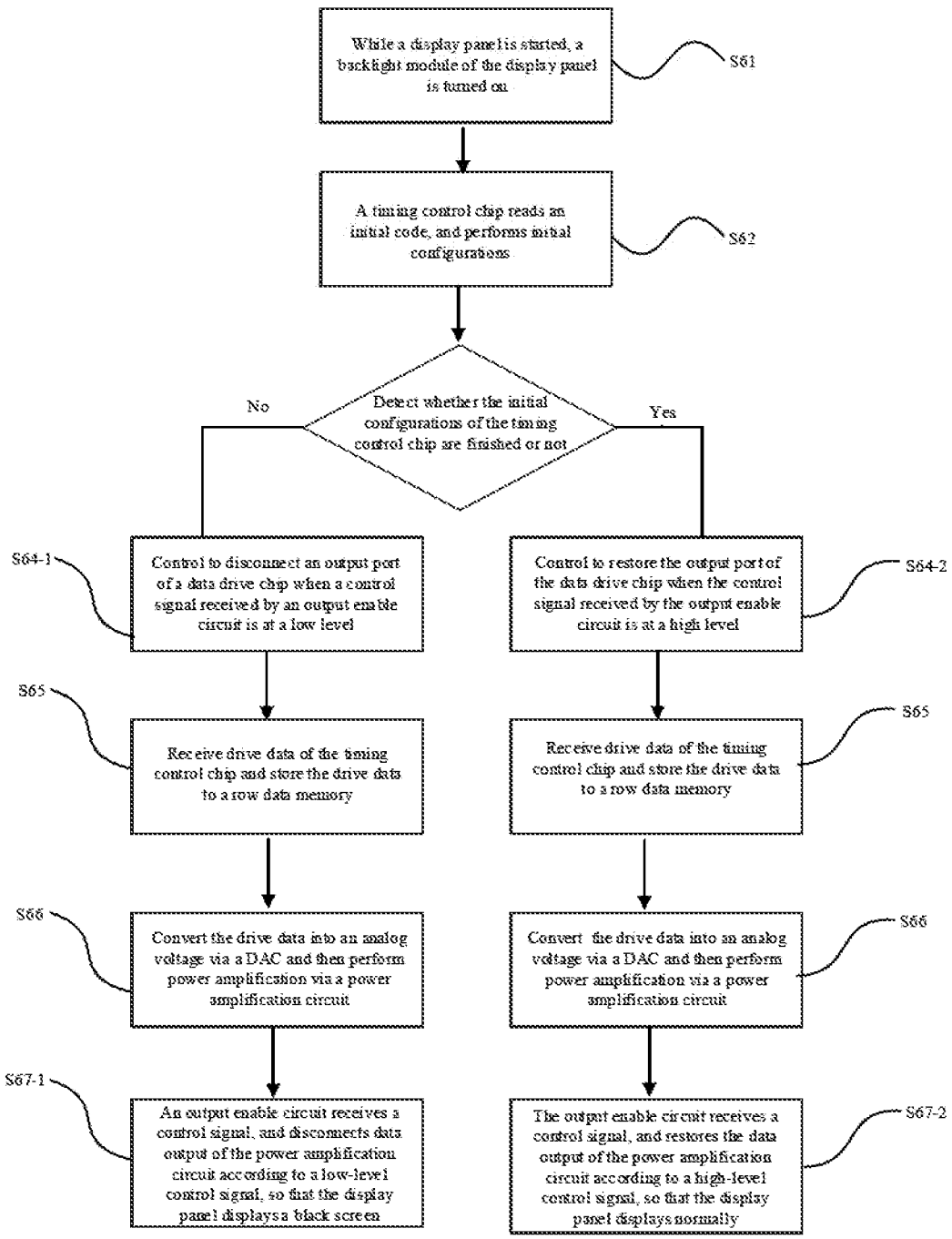
FIG. 6 is a flowchart diagram of a display panel driving method in an embodiment of the present application.

As another embodiment of the present application, referring to FIG. 1, FIG. 2 and FIG. 6, the present application discloses a display panel 140, which includes: a backlight module 150, disposed in the display panel 140, and turned on while the display panel 140 is started; a timing control chip 110, configured to read an initial code and perform initial configurations after the display panel 140 is started, and simultaneously, detect whether configuration work of the initial code is completely finished or not, and correspondingly generate different control signals 112; an output enable circuit 124, configured to receive a control signal, and control data output of a data drive chip 120 according to the enable signal 113 to control voltages at two ends of a liquid crystal panel; and the data drive chip 120, configured to control picture display of the display panel 140 according to control of the output enable circuit 124.

In this solution, while the display panel 140 is started, the backlight module 150 is turned on; the timing control chip 110 reads the initial code and performs the initial configurations, and simultaneously, detects whether the configuration work of the initial code is completely finished or not, and correspondingly generates the different control signals 112; and the output enable circuit 124 controls the output of the data drive chip 120 according to the control signal 112 to control the voltages at the two ends of the liquid crystal panel, thereby controlling the picture display of the display panel 140.

In this embodiment, optionally, the timing control chip 110 includes: a control circuit 111, configured to detect whether the configuration work of the initial code of the timing control chip 110 is finished or not, and corresponding generate a high-level or low-level enable signal 113 to take as the control signal 112. The data drive chip 120 includes: a row data memory, configured to store drive data; a DAC 122, configured to convert the drive data into an analog voltage; and a power amplification circuit 123, configured to amplify a power of the analog voltage to output to a data line.

In this solution, the control circuit 111 is increased in the timing control chip 110 so as to detect whether the timing control chip 110 reads the initial code with an external memory and performs the initial configurations or not when the display panel 140 is started, and send different enable signals 113 according to different states of the timing control chip 110. In the data drive chip 120, the drive data are received to the row data memory, the DAC 122 converts the drive data into the analog voltage, the analog voltage of which the power is amplified by the power amplification circuit 123 is output to the data line, the enable signal 113 is sent to the output enable circuit 124, the data output of the data drive chip is controlled according to the output enable signal 113 and thus the picture display of the display panel 140 is controlled.

In this embodiment, optionally, the output enable circuit 124 is coupled to the power amplification circuit 123; and the output enable circuit 124 receives the enable signal 113, and disconnects or restores data output of the power amplification circuit 123 according to the enable signal 113.

In this solution, the output enable circuit 124 is coupled to the power amplification circuit 123, and disconnects or restores the data output of the power amplification circuit 123 according to the enable signal 113 to control voltages at two ends of a liquid crystal panel, thereby controlling picture display of the display panel 140; and therefore, the effect of controlling whether the display panel displays a picture or not is achieved.

In this embodiment, optionally, the output enable circuit 124 is coupled between the DAC 122 and the power amplification circuit 123; the output enable circuit 124 receives the enable signal 113; and the output enable circuit 124 disconnects or restores data transmission between the DAC 122 and the power amplification circuit 123 according to the enable signal 113.

In this solution, the output enable circuit 124 may further be coupled between the DAC 122 and the power amplification circuit 123, and disconnects or restores data output of the DAC 122 according to the enable signal 113 to control the voltages at the two ends of the liquid crystal panel, thereby controlling the picture display of the display panel 140; and therefore, the effect of controlling whether the display panel displays the picture or not is achieved.

In this embodiment, optionally, the output enable circuit 124 is coupled between the row data memory and the DAC 122; the output enable circuit 124 receives the enable signal 113; and the output enable circuit 124 disconnects or restores data transmission between the row data memory and the DAC 122 according to the enable signal 113.

In this solution, the output enable circuit 124 may further be coupled between the row data memory and the DAC 122, and disconnects or restores data output of the row data memory according to the enable signal 113 to control the voltages at the two ends of the liquid crystal panel, thereby controlling the picture display of the display panel 140; and therefore, the effect of controlling whether the display panel 140 displays the picture or not is achieved. The above three positions of the output enable circuit all are suitable for the implementation of the present application and are within a scope of protection of the present application.

As another embodiment of the present application, referring to FIG. 1 to FIG. 6, the present application discloses a display panel driving method, which includes:

S61: While a display module 100 is started, a display panel 140 and a backlight module 150 are turned on.
S62: A timing control chip 110 reads an initial code, and performs initial configurations.

S63-1: When it is detected that the timing control chip 110 is in a code reading and configuration process, the timing control chip 110 controls to output a low-level control signal 112.
S63-2: When it is detected that the timing control chip 110 finishes all code configurations, the timing control chip 110 outputs a high-level control signal 112.
S64: Receive drive data of the timing control chip 110.
S65: Store the drive data to a row data memory 130.
S66: Convert the drive data into an analog voltage via a DAC 122, and then perform power amplification via a power amplification circuit 123.
S67-1: When an output enable circuit 124 receives the low-level control signal 122, the output enable circuit 124 disconnects data output of the power amplification circuit 123 so as to control the display panel 140 to display a black screen.
S67-2: When the output enable circuit 124 receives the high-level control signal 112, the output enable circuit 124 restores the data output of the power amplification circuit 123 so as to control the display panel 140 to perform picture display according to drive data of a data drive chip 120.

In this solution, while the display module 100 is started, the display panel is turned on and simultaneously the backlight module 150 is turned on; the timing control chip 110 reads the initial code and performs the initial configurations; when the timing control chip 110 is in a configuration state and does not finish all configurations, the data drive chip 120 outputs the low-level control signal 112; and after the output enable circuit 124 receives the low-level control signal 112, data transmission among the row data memory, the DAC 122 and the power amplification circuit 123 is normal. By only disconnecting the data output of the power amplification circuit 123, a voltage difference between the two ends of the liquid crystal panel in the display panel 140 is zero, the display panel 140 appears the black screen and thus a condition of an abnormal startup screen is prevented. When the timing control chip 110 finishes all configurations, the data drive chip 120 outputs the high-level control signal 112; and the output enable circuit 124 restores the data output of the power amplification circuit 123 upon the reception of the high-level control signal 112, and thus the voltages at the two ends of the liquid crystal panel in the display panel 140 are different, and the display panel 140 restores the normal display.

It is to be noted that, the limit on each step related in this solution is not considered as a limit to a sequential order of the steps on the premise of not affecting implementation of a specific solution. A step written in front may be executed ahead and may also be executed later, or even may also be executed simultaneously; and as long as this solution can be implemented, all should be considered as the scope of protection of the present application.

In the present application, the panel may be a Twisted Nematic (TN) panel, an In-Plane Switching (IPS) panel, a Multi-domain Vertical Alignment (VA) panel, and of source, may also be other types of appropriate panels.

The above are further detailed descriptions of the present application in combination with specific optional implementation manners and should not be deemed as that the specific implementation of the present application is only limited to these descriptions. A person of ordinary skill in the art to which the present application belongs may further make a plurality of simple deviations or replacements without departing from the concept of the present application and all should be considered as the scope of protection of the present application.

What is claimed is:

1. A driving method of a display panel, comprising:
powering on the display panel, and simultaneously turning on a backlight module of the display panel;
reading, by a timing control chip, an initial code, and performing initial configurations based on the initial code;
detecting, by the timing control chip, whether the initial configurations based on the initial code are completely finished or not, and correspondingly generating different control signals depending on whether the initial configurations based on the initial code are completely finished or not, wherein the control signals are configured to enable or disenable output of a data drive chip; and
receiving, by an output enable circuit, a control signal, and enabling or disenabling the output of the data drive chip depending on a level of the control signal, so as to control picture display of the display panel;
wherein the step of reading, by a timing control chip, an initial code, and performing initial configurations based on the initial code comprises:
keeping the backlight module turned on while the timing control chip is reading the initial code;
wherein the step of detecting, by the timing control chip, whether the initial configurations based on the initial code are completely finished or not, and correspondingly generate different control signals depending on whether the initial configurations based on the initial code are completely finished or not comprises: in response to detecting that the timing control chip is in a code reading and configuration process, controlling to output, by the timing control chip, a low-level enable signal to be taken as the control signal;
wherein the step of receiving, by the output enable circuit, the enable signal, and enabling or disenabling output of the data drive chip depending on a level of the enable signal, so as to control picture display of the display panel comprises: controlling to disconnect an output port of the data drive chip when the enable signal received by the output enable circuit is at a low level.

2. The driving method according to claim 1, wherein the step of detecting, by the timing control chip, whether the initial configurations based on the initial code are completely finished or not, and correspondingly generating different control signals depending on whether the initial configurations based on the initial code are completely finished or not comprises:
in response to detecting that the timing control chip has finished all code configurations, outputting, by the timing control chip, a high-level enable signal to be taken as the control signal.

3. The driving method according to claim 2, wherein the step of receiving, by an output enable circuit, an enable signal, and enabling or disenabling output of the data drive chip depending on a level of the enable signal, so as to control picture display of the display panel comprises:
controlling to restore the output port of the data drive chip when the enable signal received by the output enable circuit is at a high level.

4. The driving method according to claim 1, wherein the timing control chip comprises a control circuit; the control circuit detects whether the initial configurations based on the initial code of the timing control chip is completely finished or not, and outputs the control signal to the data drive chip;
the data drive chip comprises the output enable circuit; the output enable circuit receives the control signal, and enables or disenables data output of the data drive chip depending on a level of the control signal to control voltages at two ends of a liquid crystal panel, thereby controlling the display of the display panel.

5. A driving method of a display panel, comprising:
powering on the display panel, and simultaneously turning on a backlight module of the display panel;
reading, by a timing control chip, an initial code, and performing initial configurations based on the initial code;
in response to detecting that the timing control chip is in a code reading and configuration process, controlling to output, by the timing control chip, a low-level enable signal; and in response to detecting that the timing control chip has finished all of the initial configurations, outputting, by the timing control chip, a high-level enable signal;
receiving drive data of the timing control chip;
storing the drive data to a row data memory;
converting the drive data into an analog voltage via a Digital-to-Analog Converter (DAC), and then performing power amplification via a power amplification circuit;
in response to receiving the low-level enable signal, disconnecting, by the output enable circuit, data output of the power amplification circuit so as to control the display panel to display a black screen, wherein disconnecting by the output enable circuit the data output of the power amplification circuit so as to control the display panel to display a black screen comprises controlling to disconnect an output port of the data drive chip; and
in response to receiving the high-level enable signal, restoring, by the output enable circuit, the data output of the power amplification circuit so as to control the display panel to perform picture display according to the drive data of the data drive chip;
wherein the step of reading, by a timing control chip, an initial code, and performing initial configurations based on the initial code comprises:
keeping the backlight module turned on while the timing control chip is reading the initial code.

6. A display panel, comprising:
a backlight module, disposed in the display panel, and operative to be turned on simultaneously when the display panel is powered on; a timing control chip, configured to read an initial code and perform initial configurations, and simultaneously detect whether the initial configurations based on the initial code are completely finished or not, and correspondingly generate different control signals depending on whether the initial configurations based on the initial code are completely finished or not, wherein the control signals are configured to enable or disenable output of a data drive chip, wherein the timing control chip comprises a control circuit configured to detect whether the initial configurations based on the initial code of the timing control chip are finished or not, and correspondingly generate a high-level or low-level enable signal to be taken as the control signal; wherein in response to detecting that the timing control chip is in a code reading and configuration process, the timing control chip is configured to output the low-level enable signal to be taken as the control signal;

an output enable circuit, wherein the output enable circuit is configured to receive a control signal, and control data output of the data drive chip depending on a level of the control signal to control voltages at two ends of a liquid crystal panel; and the data drive chip, configured to control the voltages at the two ends of the liquid crystal panel according to control of the output enable circuit, thereby controlling picture display of the display panel; wherein the output enable circuit is configured to control to disconnect an output port of the data drive chip when the enable signal received by the output enable circuit is at a low level;

wherein the backlight module is kept on while the timing control chip is reading the initial code.

7. The display panel according to claim 6, wherein the data drive chip comprises:

a row data memory, configured to store drive data;

a Digital-to-Analog Converter (DAC), configured to convert the drive data into an analog voltage; and a power amplification circuit, configured to amplify a power of the analog voltage to output to a data line.

8. The driving method according to claim 1, wherein the data drive chip has been powered on prior to the completion of the initial configurations of the initial code by the timing control chip.

9. The display panel according to claim 7, wherein the data drive chip has only one output enable circuit, which has two input terminals, wherein one input terminal is directly electrically connected to the power amplification circuit, and another input terminal is directly electrically connected to the control circuit; and wherein the output enable circuit is configured to receive the enable signal, and disconnect or restore data output of the power amplification circuit depending on a level of the enable signal.

10. The display panel according to claim 7, wherein the data drive chip has only one output enable circuit, which has two input terminals, wherein one input terminal is directly electrically connected between the DAC and the power amplification circuit, and another input terminal is directly electrically connected to the control circuit;

wherein the output enable circuit is configured to receive the enable signal, and disconnect or restore data transmission between the DAC and the power amplification circuit depending on a level of the enable signal.

11. The display panel according to claim 7, wherein the data drive chip has only one output enable circuit, which has two input terminals, wherein one input terminal is directly electrically connected between the row data memory and the DAC, and another input terminal is directly electrically connected to the control circuit;

wherein the output enable circuit is configured to receive the enable signal, and disconnect or restore data transmission between the row data memory and the DAC depending on a level of the enable signal.

12. The display panel according to claim 7, wherein the data drive chip has two output enable circuits, wherein one output enable circuit has two input terminals, wherein one input terminal is directly electrically connected to the power amplification circuit, another input terminal is directly electrically connected to the control circuit; wherein another output enable circuit has two input terminals, wherein one input terminal is directly electrically connected between the DAC and the power amplification circuit, and another input terminal is directly electrically connected to the control circuit; and wherein each output enable circuit is configured to receive the enable signal, and disconnect or restore data output of the power amplification circuit and the DAC depending on a level of the enable signal.

13. The display panel according to claim 7, wherein the data drive chip has two output enable circuits, wherein one output enable circuit has two input terminals, wherein one input terminal is directly electrically connected to the power amplification circuit, and another input terminal is directly electrically connected to the control circuit; wherein another output enable circuit has two input terminals, wherein one input terminal is directly electrically connected between the row data memory and the DAC, and another input terminal is directly electrically connected to the control circuit; and wherein each output enable circuit is configured to receive the enable signal, and disconnect or restore data output of the power amplification circuit and the row data memory depending on a level of the enable signal.

14. The display panel according to claim 7, wherein the data drive chip has two output enable circuits, wherein one output enable circuit has two input terminals, wherein one input terminal is directly electrically connected between the DAC and the power amplification circuit, and another input terminal is directly electrically connected to the control circuit; wherein another output enable circuit has two input terminals, wherein one input terminal is directly electrically connected between the row data memory and the DAC, and another input terminal is directly electrically connected to the control circuit; and wherein each output enable circuit is configured to receive the enable signal, and disconnect or restore data output of the DAC and the row data memory depending on a level of the enable signal.

* * * * *